(12) United States Patent
Chandrasekhar et al.

(10) Patent No.: US 7,956,713 B2
(45) Date of Patent: Jun. 7, 2011

(54) FORMING A HELICAL INDUCTOR

(75) Inventors: Arun Chandrasekhar, Bangalore (IN); Srikrishnan Venkataraman, Bangalore (IN); Priyavadan R. Patel, Chandler, AZ (US); Shamala Chickamenahalli, Chandler, AZ (US); Robert J. Fite, Olympia, WA (US); Charan Gurumurthy, Higley, AZ (US)

(73) Assignee: Intel Corporation, Santa Clara, CA (US)

( * ) Notice: Subject to any disclaimer, the term of this patent is extended or adjusted under 35 U.S.C. 154(b) by 578 days.

(21) Appl. No.: 11/903,908

(22) Filed: Sep. 25, 2007

(65) Prior Publication Data

US 2009/0079530 A1    Mar. 26, 2009

(51) Int. Cl.
   *H01F 5/00*    (2006.01)
(52) U.S. Cl. .......................... 336/200; 174/266; 361/761
(58) Field of Classification Search .................. 336/200, 336/223, 232; 174/262, 266; 361/761
See application file for complete search history.

(56) References Cited

U.S. PATENT DOCUMENTS

| | | | | |
|---|---|---|---|---|
| 3,148,356 A | * | 9/1964 | Hedden, Jr. ..................... | 365/55 |
| 3,509,270 A | * | 4/1970 | Yorgensen et al. ............ | 174/266 |
| 5,095,357 A | * | 3/1992 | Andoh et al. ................. | 257/379 |
| 5,487,214 A | * | 1/1996 | Walters ........................ | 29/602.1 |
| 6,091,310 A | * | 7/2000 | Utsumi et al. .................. | 333/12 |
| 6,573,822 B2 | * | 6/2003 | Ma et al. ....................... | 336/223 |
| 6,711,814 B2 | * | 3/2004 | Barr et al. ...................... | 29/852 |
| 7,170,384 B2 | * | 1/2007 | Kim et al. ..................... | 336/200 |
| 7,248,134 B2 | * | 7/2007 | Wu et al. ....................... | 333/246 |
| 7,474,539 B2 | * | 1/2009 | Huang et al. .................. | 361/782 |
| 7,486,167 B2 | * | 2/2009 | Loke et al. .................... | 336/200 |
| 7,579,824 B2 | * | 8/2009 | Rea et al. .................. | 324/117 R |
| 7,795,728 B2 | * | 9/2010 | Przadka ........................ | 257/724 |
| 7,843,302 B2 | * | 11/2010 | Mano et al. .................... | 336/200 |
| 2006/0290002 A1 | | 12/2006 | Arana et al. ................... | 257/774 |

FOREIGN PATENT DOCUMENTS

JP          63048808 A    *    3/1988

OTHER PUBLICATIONS

U.S. Appl. No. 11/524,108, filed Sep. 20, 2006, entitled "Via Structure," by Azniza Binti Abd Aziz, et al.

* cited by examiner

*Primary Examiner* — Anh T Mai
*Assistant Examiner* — Joselito Baisa
(74) *Attorney, Agent, or Firm* — Trop, Pruner & Hu, P.C.

(57) ABSTRACT

In one embodiment, the present invention includes an apparatus having a substrate with vias extending between first and second surfaces thereof, and at least one helical inductor adapted within a via, which may be formed of a conductive material. Other embodiments are described and claimed.

18 Claims, 5 Drawing Sheets

FORMING A HELICAL INDUCTOR

BACKGROUND

Semiconductor packages typically include a so-called package substrate on which a semiconductor die is adapted. In addition to providing support for the semiconductor die, the package substrate provides interconnects to enable electrical contact between the semiconductor die and an underlying substrate such as a circuit board on which the semiconductor device is adapted. Some package substrates include multiple layers including conductive circuitry to enable interconnection of power and signal information to and from one or more semiconductor die of the semiconductor device.

To this end, some package substrates, as well as many semiconductor die include vias, such as plated through holes (PTHs), that can serve to connect routing traces, as well as transmit power. Such vias are formed by making a hole through some or all substrate layers. The interior hole surface of the via may be coated or plated with an electrically conductive material such as a metal, e.g., copper to enable transmission of power or signal information.

To provide power to semiconductor die, oftentimes voltage regulation circuitry is present on the package substrate or another substrate. Such circuitry includes power generation and delivery components, as well as passive components such as capacitors and inductors. Other uses for inductors can be in radio frequency (RF) circuitry and compensation circuitry. However, such passive components can consume significant area.

DETAILED DESCRIPTION

In various embodiments, passive devices such as inductors and transformers may be provided in a vertical orientation within vias of a substrate such as a package substrate or semiconductor die. In various embodiments, plated through holes (PTHs) of the substrate may be adapted with such inductors or transformers, which may take a helical form, in many implementations.

Figure 1:
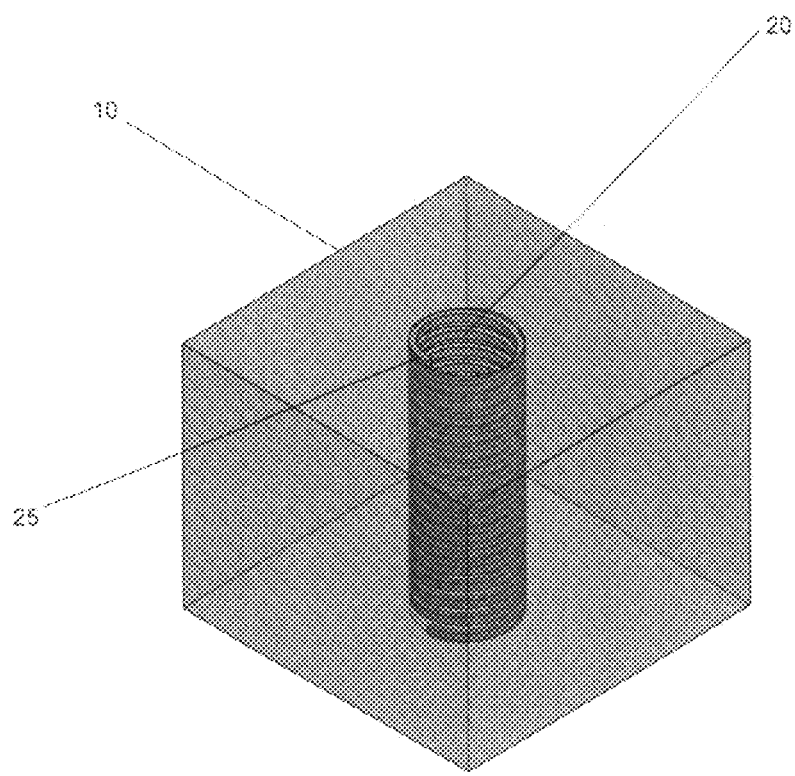
FIG. 1 is a plan view of a substrate in accordance with one embodiment of the present invention.

Referring now to FIG. 1, shown is a plan view of a substrate in accordance with one embodiment of the present invention. As shown in FIG. 1, substrate 10 may be a package substrate, semiconductor die or other such substrate such as a printed circuit board (PCB). While not shown for ease of illustration in FIG. 1, understand that substrate 10 may include a plurality of layers, including conductive layers having traces or other circuitry formed therein, and insulation layers such as dielectric layers adapted between the conductive layers. As shown in FIG. 1, substrate 10 includes a via 20, which is a PTH that extends from a first surface of substrate 10 to a second surface of substrate 10. As shown in FIG. 1, a helical inductor 25 may be adapted within via 20. In various embodiments, different conductive materials such as different metals may be used to form the inductor. As shown, inductor 25 is thus oriented along the vertical Z axis. Note that a given substrate may include numerous PTHs, as some substrates have PTHs numbering in the thousands, which may provide many opportunities to insert helical inductors and transformers in accordance with an embodiment of the present invention.

By providing an inductor within a via, efficient realization of area occurs. While the scope of the present invention is not limited in this regard, in some embodiments via 20 may have a diameter of approximately 400 microns (µms) and a metallization thickness of inductor 25 may be approximately 20 µm, with a minimum line width and spacing of approximately 25 µm. Further, the thickness of via 20 may be approximately 800 microns, although different dimensions are possible. Inductors with varying numbers of turns may be provided in different embodiments. Such inductors may be used in power delivery circuits such as a voltage regulator or compensation circuits, such as for compensation for high speed signals to thereby increase bus speeds when compensating for capacitive effects of pads and planes. In yet other embodiments, such inductors may be used as radio frequency (RF) tank elements such as for wireless devices.

Figure 2A:
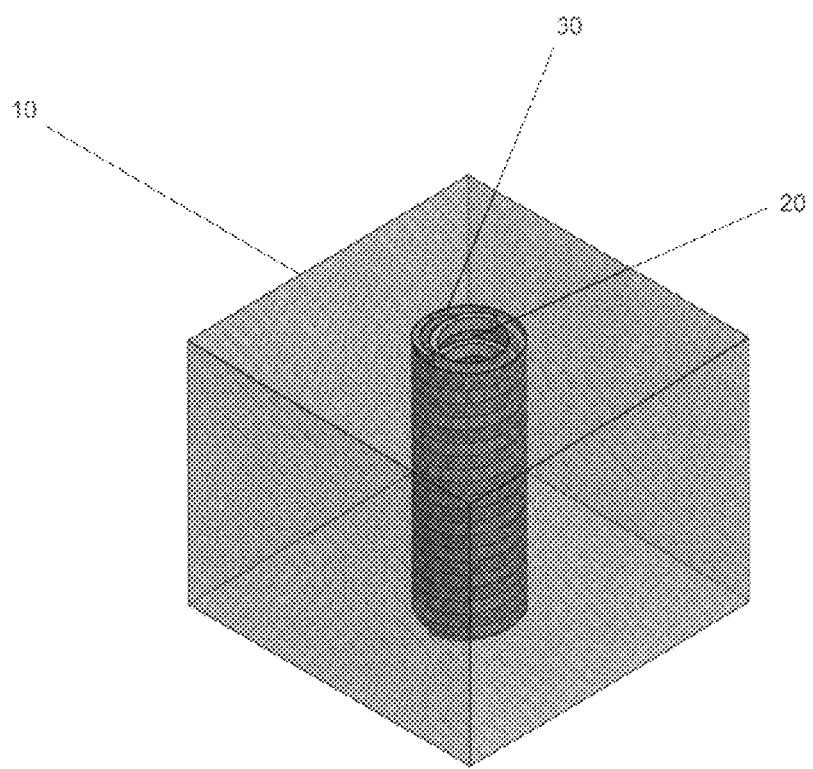
FIG. 2A is a plan view of a substrate in accordance with another embodiment of the present invention.
Figure 2B:
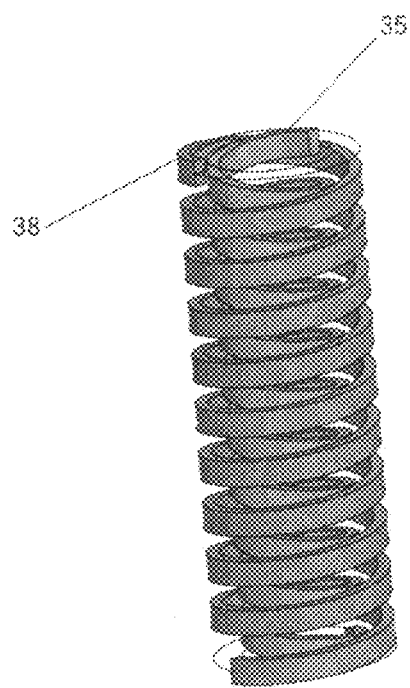
FIG. 2B is a detailed view of a transformer in accordance with an embodiment of the present invention.

Referring now to FIG. 2A, shown is a plan view of a substrate in accordance with another embodiment of the present invention. As shown in FIG. 2A, substrate 10 includes a via 20. Instead of an inductor, via 20 may have a transformer 30 adapted therein. FIG. 2B shows a detailed view of a transformer in accordance with an embodiment of the present invention. As shown in FIG. 2B, transformer 30 may be formed of a pair of coils, namely a first coil 35, which may be formed of a conductive material, e.g., a metal, and a second coil 38, which may be formed of conductive material (and which can be formed of the same metal as first coil 35). Note that each coil is wound in the opposite direction (e.g., downwardly and upwardly), as shown in FIG. 2B. Note that while shown in FIGS. 2A and 2B as being a transformer, a similar arrangement may be used to form a coupled inductor in accordance with an embodiment of the present invention. Furthermore, while not shown in the embodiments of FIGS. 1 and 2, understand that a ferrite material may be coated within via 20 (e.g., along an inner wall of the via) to increase coupling, as well as contain magnetic (H) fields created by the inductor/transformer. In some embodiments transformer 30 may include a ferrite material adapted between first coil 35 and second coil 38 to improve coupling.

Inductors and transformers formed in accordance with an embodiment of the present invention may be realized in different manners. In some embodiments, such components may be formed in a prefabricated manner and then adapted within a via. In this way, a given substrate is formed and vias are created, e.g., by drilling or in another such manner. Then the prefabricated coil or coils that form the inductor or transformer may be adapted within the via and a plug and lid plate may be provided to maintain the component in the via. In other embodiments, the component may be integrated within the substrate. For example, the via may be drilled, e.g., using a corkscrew drill to enable creation of a corkscrew-type pattern within the via. Then, a plating process such as electroless plating process may be performed to form the helical inductor. Of course, inductors and transformers may be adapted within vias in other manners in different embodiments.

Using embodiments of the present invention, various real estate, inductance and Q-factor advantages may be realized as compared to planar (i.e., spiral) inductors. For example, for the same inductance levels, a helical inductor in accordance with an embodiment of the present invention may occupy only approximately 10% of the area of a planar inductor. For the same amount of real estate, inductances of greater than approximately 40 times that of a conventional spiral inductor may be realized. Still further, Q factors at a frequency of 1 gigahertz (GHz) may realize gains of approximately 3 times for the same real estate, and gains of greater than approximately 1.25 times for the same inductance levels.

Figure 3:
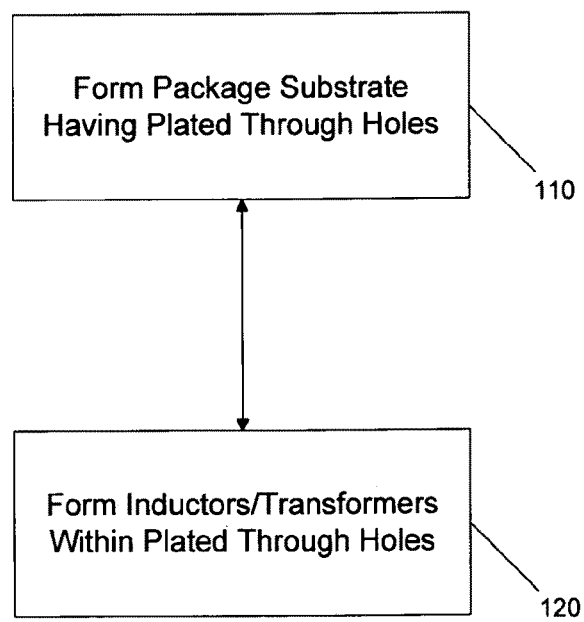
FIG. 3 is flow diagram of a method in accordance with one embodiment of the present invention.

Referring now to FIG. 3, shown is flow diagram of a method in accordance with one embodiment of the present invention. As shown in FIG. 3, method 100 may be used to provide inductors/transformers within plated through holes of a package substrate in accordance with an embodiment of the present invention. As shown in FIG. 3, method 100 may begin by forming a substrate having plated through holes (block 110). For example, a package substrate may be formed by obtaining a core material and forming build-up layers on the core material. Such build-up layers may include dielectric layers and conductive layers. After forming of the package substrate, e.g., including curing and other processes, plated through holes may be formed. As described above, such PTHs may be formed by drilling. Furthermore, in some implementations at least some of the PTHs may have one or more conductive layers formed along the inner wall of the PTHs.

Referring still to FIG. 3, next various inductors/transformers may be formed within selected ones of the plated through holes (block 120). For example, certain PTHs may be associated with voltage regulator circuits, compensation circuits, oscillator circuits and so forth. Such PTHs may have various types of inductors/transformers adapted therein. As described above, the inductor/transformers may be prefabricated and placed within the vias, or they may be formed integrally within the via, e.g., using a plating process such as an electroless plating process. While described with this particular implementation in the embodiment of FIG. 3, the scope of the present invention is not limited in this regard.

While the scope of the present invention is not limited in this regard, in many embodiments inductors and transformers may be adapted in semiconductor devices such as a microprocessor and/or chipset package. In this way, improved power delivery performance may be realized when the passive component is used as a voltage regulator element, for example, an on-die voltage regulator. Furthermore, bus speeds may be increased when such passive components are used as compensation elements for high speed signals. In addition, for wireless or other devices, the passive components may be used in forming a high-quality RF tank circuit.

Figure 4:
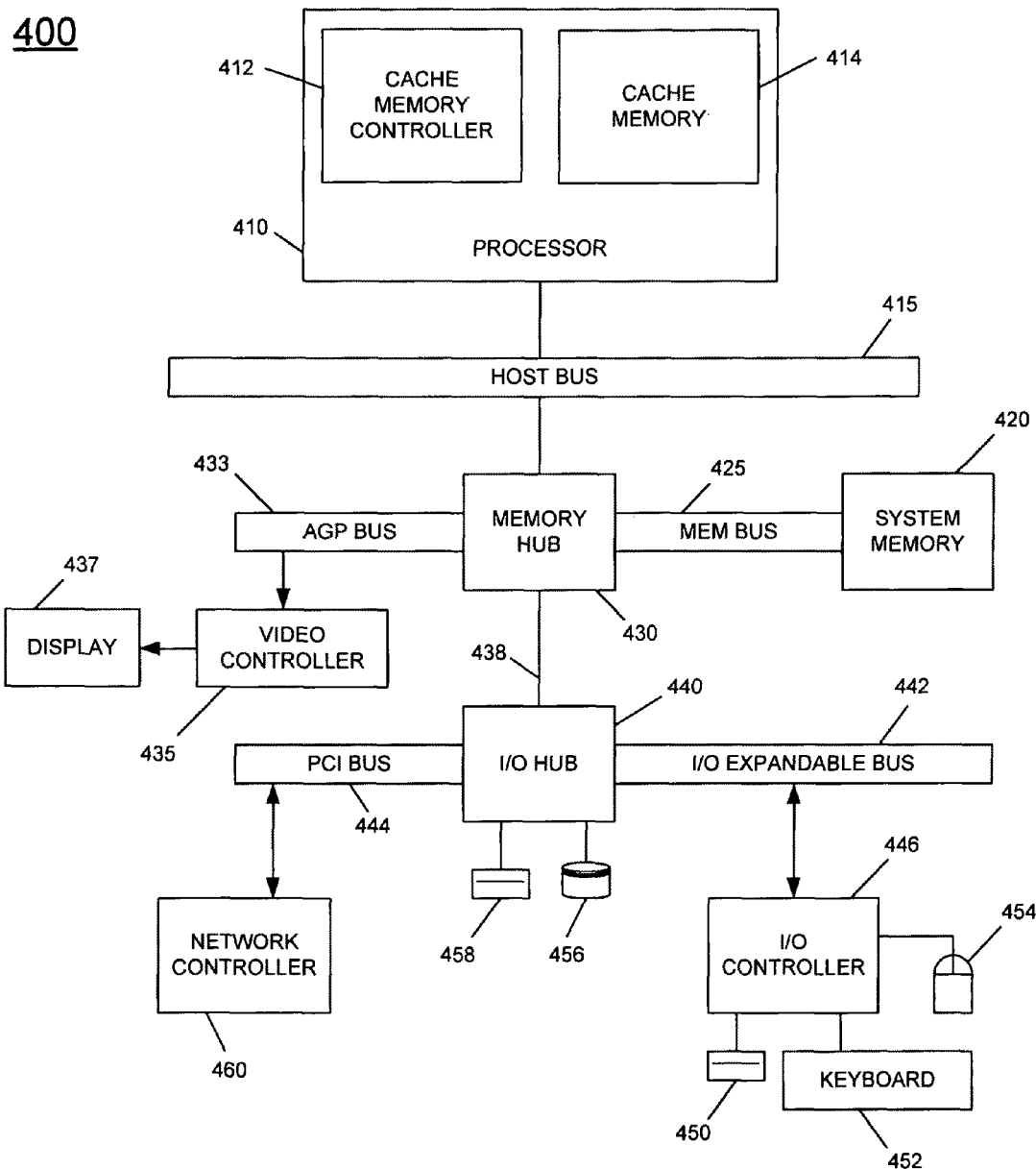
FIG. 4 is a block diagram of a computer system in which embodiments of the invention may be used.

Semiconductor packages having inductors/transformers formed in accordance with an embodiment may be used in various systems. FIG. 4 is a block diagram of a computer system 400 in which embodiments of the invention may be used. As used herein, the term "computer system" may refer to any type of processor-based system, such as a notebook computer, a server computer, a laptop computer, or the like.

Now referring to FIG. 4, in one embodiment, computer system 400 includes a processor 410, which may include a general-purpose or special-purpose processor such as a microprocessor, microcontroller, a programmable gate array, and the like. Processor 410 may include a cache memory controller 412 and a cache memory 414. Processor 410 may be coupled over a host bus 415 to a memory hub 430 in one embodiment, which may be coupled to a system memory 420 (e.g., a dynamic RAM) via a memory bus 425. Memory hub 430 may also be coupled over an Advanced Graphics Port (AGP) bus 433 to a video controller 435, which may be coupled to a display 437.

Memory hub 430 may also be coupled (via a hub link 438) to an input/output (I/O) hub 440 that is coupled to an input/output (I/O) expansion bus 442 and a Peripheral Component Interconnect (PCI) bus 444, as defined by the PCI Local Bus Specification, Production Version, Revision 2.1 dated June 1995. In one embodiment, processor 410 (at least) may be adapted in a package having a package substrate with a plurality of inductors/transformers in accordance with an embodiment of the present invention and coupled, e.g., through a socket to a circuit board of system 400.

I/O expansion bus 442 may be coupled to an I/O controller 446 that controls access to one or more I/O devices. As shown in FIG. 4, these devices may include in one embodiment storage devices, such as a floppy disk drive 450 and input devices, such as a keyboard 452 and a mouse 454. I/O hub 440 may also be coupled to, for example, a hard disk drive 458 and a compact disc (CD) drive 456, as shown in FIG. 4. It is to be understood that other storage media may also be included in the system.

PCI bus 444 may also be coupled to various components including, for example, a network controller 460 that is coupled to a network port (not shown). Additional devices may be coupled to the I/O expansion bus 442 and the PCI bus 444. Although the description makes reference to specific components of system 400, it is contemplated that numerous modifications and variations of the described and illustrated embodiments may be possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a substrate having a first surface and a second surface, the substrate having a plurality of vias extending between the first surface and the second surface;
    at least one helical inductor adapted within a corresponding one of the plurality of vias, the helical inductor formed of a conductive material and extending between the first surface and the second surface; and
    a transformer, adapted within the corresponding via, that includes a first coil at least partially included within a second coil.

2. The apparatus of claim 1, wherein the at least one helical inductor comprises a coupled inductor.

3. The apparatus of claim 2, further comprising a ferrite material coated on an inner wall of the corresponding via, wherein the ferrite material is to contain a magnetic field of the helical inductor.

4. The apparatus of claim 3, wherein the ferrite material is to increase coupling of the helical inductor.

5. The apparatus of claim 1, further comprising a voltage regulator to provide power to a semiconductor die coupled to the substrate, the voltage regulator adapted on the substrate, wherein the helical inductor is coupled to the voltage regulator and the substrate comprises a package substrate.

6. The apparatus of claim 1, wherein (a) the first coil is included in the helical inductor (b) a ferrite material is adapted between the first and second coils, (c) and the first coil is wound in an opposite direction to the second coil.

7. The apparatus of claim 1, wherein the at least one helical inductor is part of a compensation circuit to compensate capacitance effects of signal communication.

8. The apparatus of claim 1, further comprising a ferrite material included in the corresponding via.

9. The apparatus of claim 1, wherein a maximum outer diameter of the first coil is less than a maximum outer diameter of the second coil.

10. A method comprising:
forming a substrate having a first surface and a second surface, the substrate having a plurality of vias extending between the first surface and the second surface;
forming at least one helical inductor including a first coil, the first coil including a winding adapted entirely within a corresponding one of the plurality of vias, the helical inductor formed of a conductive material and extending between the first surface and the second surface; and
adapting a transformer, within the corresponding via, formed of the first coil and a second coil, both coils having multiple windings included entirely within the via, the first coil wound in an opposite direction to the second coil, wherein the transformer further includes a ferrite material adapted between the first coil and the second coil.

11. The method of claim 10, further comprising forming the helical inductor in a plated through hole (PTH) comprising the corresponding via.

12. The method of claim 11, further comprising coating a ferrite material within the PTH, the ferrite material to shield a magnetic field of the helical inductor.

13. The method of claim 12, further comprising drilling a hole to form the corresponding via, adapting the helical inductor in the via, plugging the via, and adapting a lid plate on the via.

14. The method of claim 11, further comprising:
adapting a semiconductor die on the substrate, wherein the substrate is a package substrate;
forming a voltage regulator on the package substrate, wherein the voltage regulator is to provide power to the semiconductor die, wherein the helical inductor is part of the voltage regulator.

15. The method of claim 10, further comprising corkscrew drilling a hole to form the corresponding via and plating the helical inductor in a corkscrew pattern formed by the corkscrew drilling.

16. The method of claim 10 including forming a first portion of the first coil at least partially within a second portion of the second coil, the first and second portions included entirely in the via.

17. An apparatus comprising:
a semiconductor die having a first surface and a second surface, the semiconductor die having a plurality of vias extending between the first surface and the second surface;
at least one helical inductor adapted within a corresponding one of the plurality of vias, the helical inductor formed of a conductive material and extending between the first surface and the second surface;
wherein the at least one helical inductor comprises a coupled inductor, the coupled inductor including a first coil at least partially included within a second coil.

18. The apparatus of claim 17, further comprising a ferrite material included in the corresponding via.

* * * * *